(12) United States Patent
Lee (10) Patent No.: US 8,864,329 B2
(45) Date of Patent: Oct. 21, 2014

(54) TRANSFER APPARATUS FOR CELL MADE ORGANIC LIGHT-EMITTING DIODE DISPLAY DEVICE

(75) Inventor: Jae-Pil Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 1037 days.

(21) Appl. No.: 12/882,609

(22) Filed: Sep. 15, 2010

(65) Prior Publication Data

US 2011/0200414 A1    Aug. 18, 2011

(30) Foreign Application Priority Data

Feb. 12, 2010 (KR) .................. 10-2010-0013535

(51) Int. Cl.
*H01L 21/677* (2006.01)
*H01L 51/56* (2006.01)

(52) U.S. Cl.
CPC ........... *H01L 51/56* (2013.01); *H01L 2251/566* (2013.01)
USPC ........................................................ 362/96

(58) Field of Classification Search
USPC .................. 362/96; 414/222.08, 806; 83/879
See application file for complete search history.

(56) References Cited

FOREIGN PATENT DOCUMENTS

| CN | 101504926 A | 8/2009 |
|---|---|---|
| CN | 101580179 A | 11/2009 |
| JP | 63016895 A | 1/1988 |
| JP | 6-255771 | 9/1994 |
| JP | 09108882 A | 4/1997 |
| JP | 09234580 A | 9/1997 |
| JP | 11-129195 | 5/1999 |
| JP | 2000033444 A | 2/2000 |
| JP | 2005257480 A | 9/2005 |
| JP | 2009208964 A | 9/2009 |
| KR | 97-63590 | 12/1997 |
| KR | 100748305 B | 8/2007 |
| KR | 10-2008-0012039 | 2/2008 |
| KR | 100898607 B | 5/2009 |
| KR | 100898607 B1 | 5/2009 |
| KR | 1020090086047 A | 8/2009 |

*Primary Examiner* — Anh Mai
*Assistant Examiner* — Brenitra M Lee
(74) *Attorney, Agent, or Firm* — Robert E. Bushnell, Esq.

(57) ABSTRACT

An organic light-emitting (OLED) display panel cell transfer apparatus that includes: a base; a scribing table to cut OLED display panel sticks into cells; a cell transfer unit disposed above the base, to transfer the cells from the scribing table to a loading location; a first shuttle to receive the cells from the cell transfer unit, at the loading location, and to transfer the cells from the loading location to a testing location; and a second shuttle to receive the cells from the cell transfer unit, at the loading location, and to transfer the cells from the loading location to the testing location.

10 Claims, 7 Drawing Sheets

TRANSFER APPARATUS FOR CELL MADE ORGANIC LIGHT-EMITTING DIODE DISPLAY DEVICE

CROSS-REFERENCE TO RELATED APPLICATION

This application claims the benefit of Korean Application No. 10-2010-0013535, filed on Feb. 12, 2010, in the Korean Intellectual Property Office, the disclosure of which is incorporated herein, by reference.

BACKGROUND

1. Field

The described technology relates generally to an organic light-emitting diode (OLED) display cell transfer apparatus.

2. Description of the Related Art

Sticks are formed by cutting out a large base substrate in one direction, and a plurality of cells, that is, a plurality of organic light-emitting display panel cells, are formed by cutting each stick in the width direction. In order to cut a completed base substrate into sticks, cut the sticks into cells, and test the cut-out cells, transfer apparatuses are used for transferring the base substrate, the sticks, or the cells to appropriate processing devices.

Before the light-emitting display panel cells are transferred to a testing location, the sticks are inserted into a cassette and then moved to a scribing table. After that, each stick is cut into a plurality of cells. The cells are transferred to a test processing location from the scribing table, to test for defects. In this case, an organic light-emitting display panel cell transfer apparatus is used to transfer the cells to the test processing location, from the scribing table.

A conventional organic light-emitting display panel cell transfer apparatus has a simple structure because is uses a conveyor, but cells are arranged in close proximity on the conveyor when they are transferred, that is, the cut cells are arranged in the same manner as when they were disposed in the sticks. Thus, the cells may be damaged due to impacts that occur as a result of the motion of the conveyor. Therefore, sides and/or corners of the cells collide with each other, while the cells are transferred from the scribing table to the test processing location. Accordingly, the cell glass of the cell may be damaged, resulting in defective/poor quality cells.

The above information disclosed in this Background section is only for enhancement of understanding of the background of the described technology and therefore it may contain information that does not form prior art.

SUMMARY

Aspects of the present invention provide an organic light-emitting display panel cell transfer apparatus that can prevent damage to organic light-emitting display panel cells, by stably transferring the cells, thereby improving the quality thereof.

An organic light-emitting display panel cell transfer apparatus, according to an exemplary embodiment of the present invention, includes: a base; a scribing table disposed on or adjacent to the base, to cut OLED panel sticks into cells; a cell transfer unit disposed above the base, and to transfer the cells from the scribing table to a loading location; a first shuttle to receive the cells from the transfer unit and to transfer the cells from the loading location to a testing location; and a second shuttle to receive the cells from the transfer unit and to transfer the cells from the loading location to the testing location.

According to various embodiments, the first shuttle may include a first shuttle test board to support the cells; first guides disposed on the base, extending from the loading location to the testing location; supports to connect the first shuttle test board to the first guides; and a first motor to move the first shuttle test board along the first guides.

According to various embodiments, the supports are connected to opposing edges of may the first shuttle test board, and the first motor connects one of the supports to one of the first guides.

According to various embodiments, the second shuttle may include a second shuttle test board to support the cells; second guides disposed on the base, extending from the loading location to the testing location; actuators to raise and lower the second shuttle test board with respect to the second guides; a second motor to move the second shuttle test board along the second guides.

According to various embodiments, the second shuttle can pass through the first shuttle, between the supports.

According to various embodiments, the first and second guides are parallel, and the second guides are disposed between the first guides.

According to various embodiments, the cell transfer unit may include a connection unit to pick up the cells from the scribing table, by applying a negative pressure to the cells; a third guide disposed above the base, extending from the scribing table to the loading location; an actuator to raise and lower the connection unit with respect to the third guide; and a third motor to move the connection unit along the third guide.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

Herein, when a first element is referred to as being formed or disposed "on" a second element, the first element can be disposed directly on the second element, or one or more other elements may be disposed therebetween. When a first element is referred to as being formed or disposed "directly on" a second element, no other elements are disposed therebetween. In addition, when a first element is described as being "connected to" a second element, the first element may be directly connected to the second element, or may be indirectly connected to the second element, via one or more intervening elements.

Figure 1:
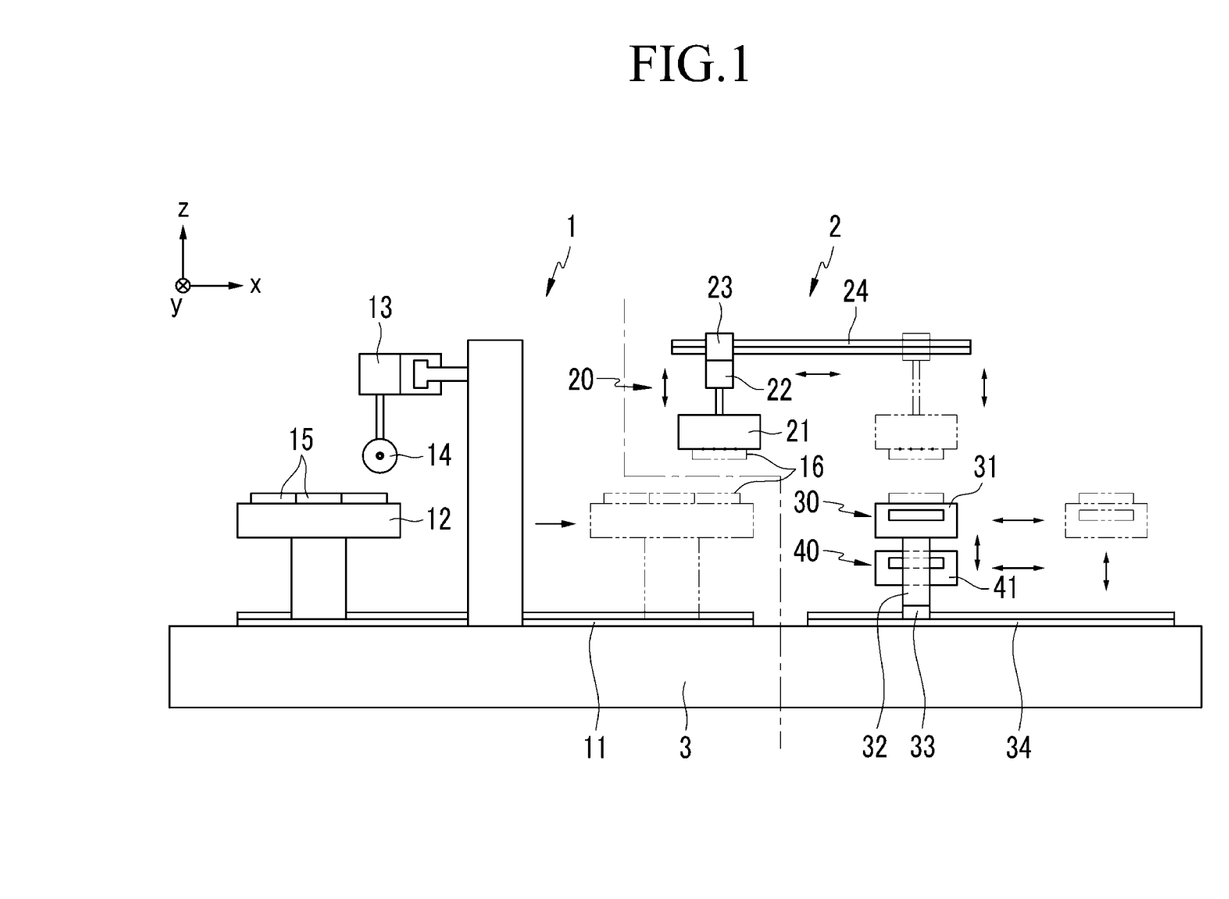
FIG. 1 is a schematic diagram of an OLED display panel cell transfer apparatus and a stick cutting apparatus, according to an exemplary embodiment.

FIG. 1 is a schematic diagram of an organic light-emitting display panel cell transfer apparatus 2 and a stick cutting apparatus 1, according to an exemplary embodiment. Referring to FIG. 1, the organic light-emitting display panel cell transfer apparatus 2 (hereinafter referred to as a cell transfer apparatus) is disposed adjacent to the stick cutting apparatus 1, and may share a base 3 with the stick cutting apparatus 1.

The stick cutting apparatus 1 includes a scribing table 12 that reciprocates in the x-axis direction, along a guide rail 11 disposed on the base 3. The stick cutting apparatus 1 also includes an actuator 13 disposed on the base 3, and a cutter 14 disposed on the actuator 13. The cutter 14 is disposed above the scribing table 12 and moves in the z-axis direction and the y-axis direction, to thereby cut sticks 15 loaded on the scribing table 12 into a plurality of organic light-emitting display panel cells 16 (hereinafter referred to as cells).

The scribing table 12 moves on the guide rail 11, to thereby transfer the cells 16 to the cell transfer apparatus 2. In this case, the spacing between the cells 16 is the same as when the cells 16 were connected in the sticks 15. A plurality of sticks 15 are formed by cutting a single base substrate, and the cells 16 are formed by cutting apart each stick 15. The scribing table 12 moves the cells 16 below one end of the cell transfer apparatus 2. The cells 16 are transferred to a loading location and then to a testing location, where a final testing of the cells 16 is performed.

The cell transfer apparatus 2 includes a cell transfer unit 20 installed above the base 3, a first shuttle 30, and a second shuttle 40. When the scribing table 12 is in position, the cells 16 on the scribing table 12 are picked up by the cell transfer unit and moved to a loading location, where they are loaded onto the first and second shuttle test board transfer units 30 and 40. The cells 16 are unloaded one by one from the first and second shuttle test board transfer units 30 and 40 in the testing location, for testing. The base 3 is formed as a horizontal plate, such that stable process spaces can be provided.

Figure 2:
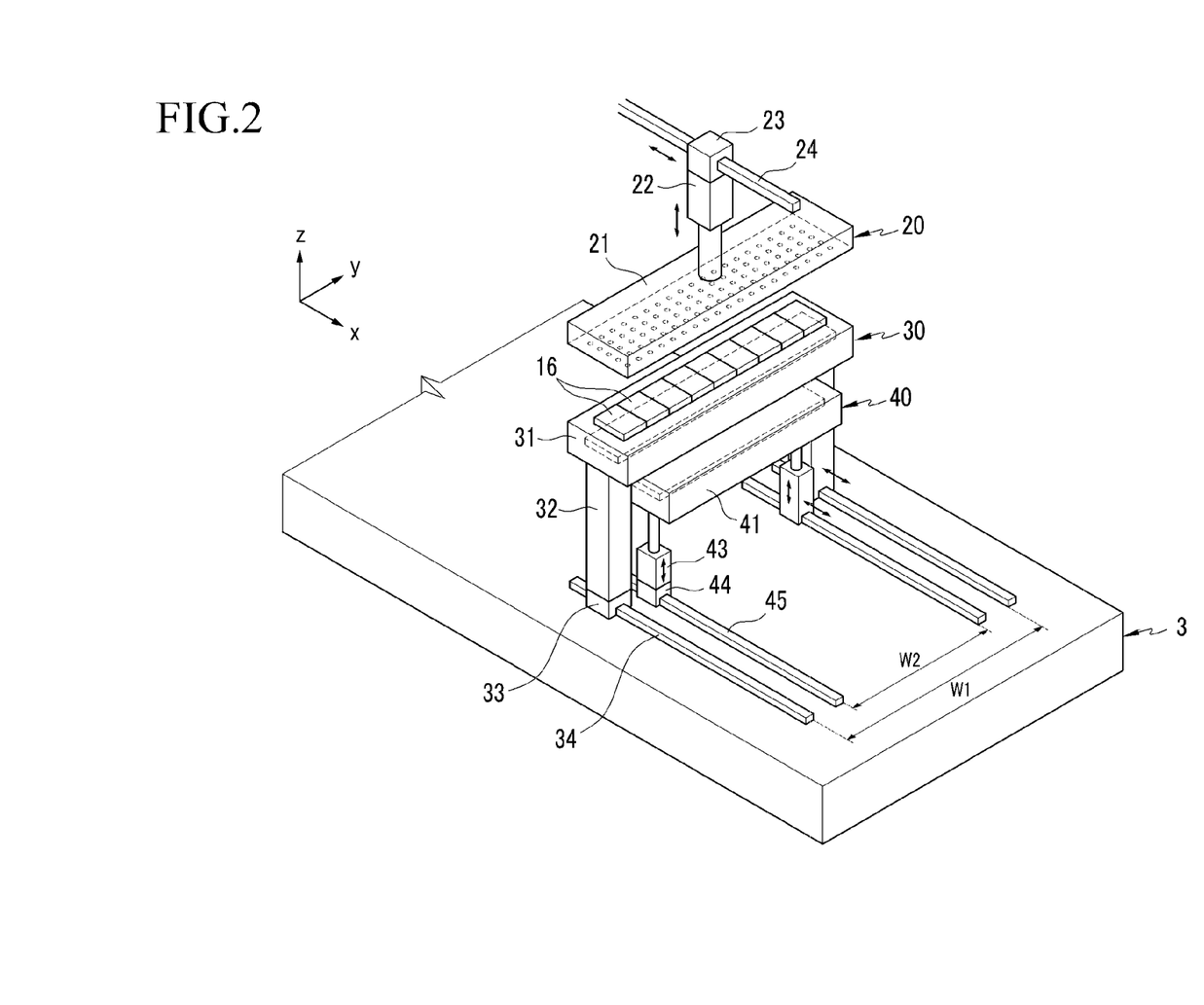
FIG. 2 is a perspective view of the OLED display panel cell transfer apparatus of FIG. 1.

FIG. 2 is a perspective view of the organic light-emitting display panel cell transfer apparatus of FIG. 1. Referring to FIG. 2, the cell transfer unit 20 is disposed above the base 3 and reciprocates in the x-axis direction. The cell transfer unit 20 moves in the z-axis direction to pick up the cells 16 from the scribing table 12 and then moves in the x-axis direction to transfer the same to the loading location. That is, the cell transfer unit 20 is lowered to the scribing table 12 and is then returns to a raised position, after picking up the cells 16. The cell transfer unit 20 then transfers the cells 16 to the loading location, where it is lowered to release the cells 16. The cell transfer unit 20 includes a connection unit 21 that applies a negative pressure to pickup the cells 16, an actuator 22 to raise and lower the connection unit 21, a third motor 23 to move the connection unit 21, and a third guide 24 to guide the movement of the connection unit 21.

The connection unit 21 includes holes that are connected to differential pressure valves (not shown), to selectively apply the negative pressure to the cells 16. The differential pressure valves control the application of the negative pressure, so as to pickup and release the cells. The connection unit 21 is formed to be larger than the maximum available size of a stick 15. The width of the connection unit 21 corresponds to the width of the sticks 15, and the length of the connection unit 21 corresponds to the length of the sticks 15.

The actuator 22 is connected to the connection unit 21 and raises and lowers the same. The actuator 22 is extended and retracted in the z-axis direction, to move the connection unit 21 with respect to the scribing table 12. The third motor 23 is mounted between the third guide 24 and the actuator 22, to move the connection unit 21 along the third guide 24. The third guide 24 extends from the scribing table 12 to the loading location, to guide the third motor 23 in the x-axis direction. The actuator 22 is generally retracted, when the connection unit 21 transfers the cells 16.

In the present exemplary embodiment, the actuator 22, the third motor 23, and the third guide 24 are singularly provided, but when the length of the connection unit 21 in the y-axis direction is large, a plurality of the actuators 22, the third motors 23, and the third guides 24 may be provided and may be disposed at substantially equal intervals, along the length of the connection unit 21, to thereby prevent sagging.

The first shuttle 30 and the second shuttle 40 increase the efficiency of the testing of the cells 16, by minimizing the time needed to load and unload the cells 16 at the loading and testing locations. Thus, the first and second shuttle test board transfer units 30 and 40 move a set distance in the x-axis direction, between the loading location and the testing location, and they do not interfere with each other.

The first shuttle 30 reciprocates between the testing location and the loading location. The second shuttle 40 is raised (extended) to reach the loading location and the testing location and is lowered (contracted) when reciprocating between the loading location and the testing location. In order to prevent interference of the first and second shuttles 30 and 40, the second shuttle 40 reciprocates while contracted, so as to pass beneath a first shuttle test board 31 of the first shuttle 31, in the z-axis direction.

In further detail, the first shuttle 30 includes the first shuttle test board 31 to support the cells 16, supports 32 to support the first shuttle test board 31, a first motor 33, and first guides 34 to guide the lateral movement of the supports 32. The first motor 33 is installed between one of the supports 32 and one of the first guides 34. The supports 32 are spaced apart in the y-axis direction, such that the second shuttle 40 can pass therebetween. The first guides 34 extend between the testing location and the loading location, on the base 3. The first motor 33 moves the first shuttle test board 31 along the first guide 34.

The second shuttle 40 includes a second shuttle test board 41 to support the cells 16, actuators 43 to raise and lower the second shuttle test board 41 in the z-axis direction, a second motor 44 to move the actuators 43 along second guides 45. The second guides 45 are installed on the base 3 and extend between the testing and loading locations. In this case, the actuators 43 and the second shuttle test board 41 can pass between the supports 32. Thus, the first guides 34 are spaced apart at a first width W1, in the y-axis direction, and the second guides 45 are spaced apart at a second width W2 that is smaller than the first width W1 and are disposed between the first guides 34.

Figure 3:
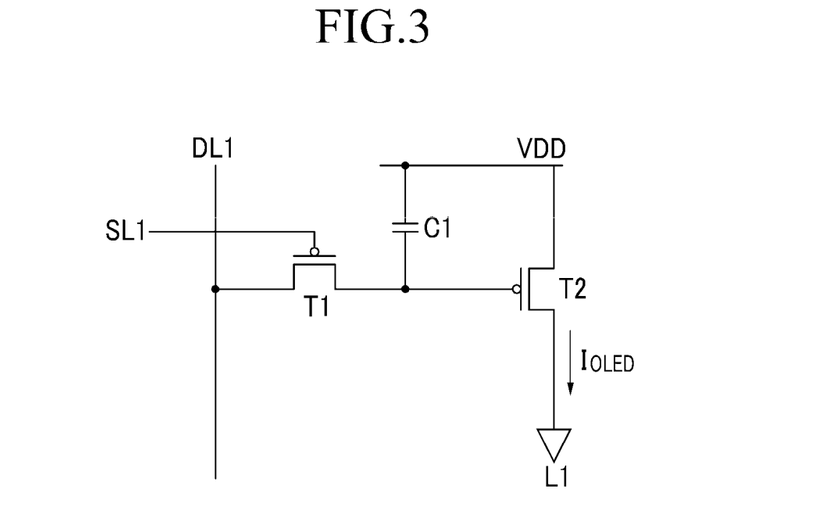
FIG. 3 is a schematic diagram of a subpixel circuit structure of the OLED display panel cell of FIG. 2.
Figure 4:
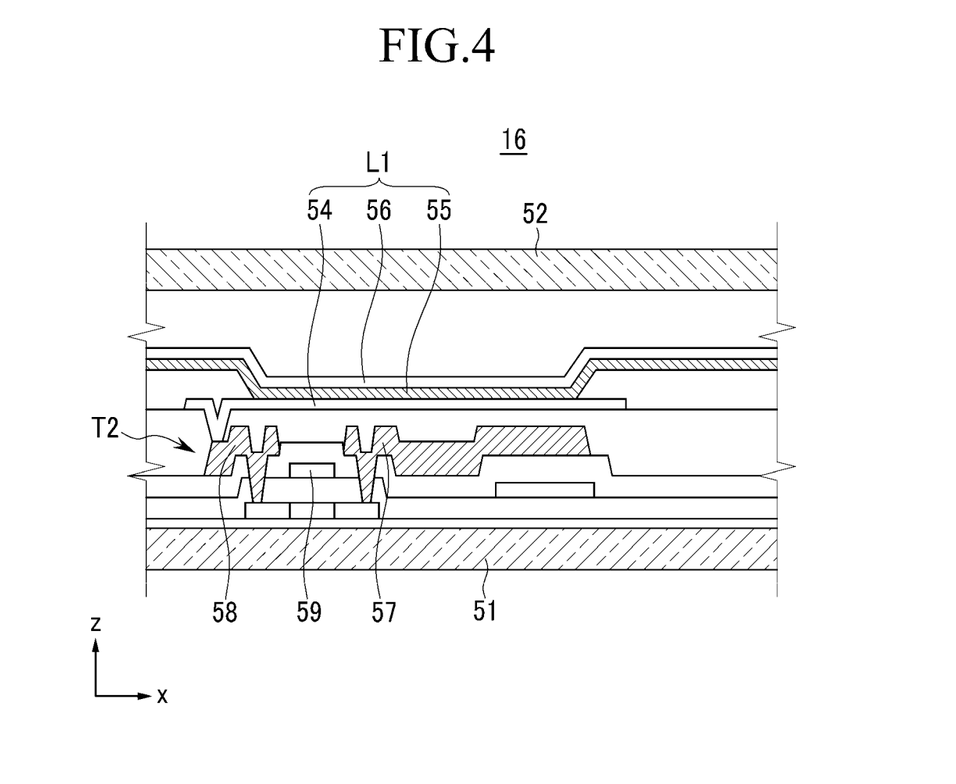
FIG. 4 is a partially enlarged cross-sectional view of the OLED display panel cell of FIG. 2.

FIG. 3 is a schematic diagram of a sub-pixel circuit structure of the organic light-emitting display panel cells 16 of FIG. 2, and FIG. 4 is a partially enlarged cross-sectional view of the organic light-emitting display panel cell 16. Referring to FIG. 3 and FIG. 4, the cell 16 includes a sub-pixel is formed of an organic light-emitting element L1 and a driving circuit. The organic light-emitting element L1 includes an anode 54, an organic emission layer 55, and a cathode 56. The driving circuit includes at least two thin film transistors and at least one storage capacitor C1. Thin film transistor basically includes a switching transistor T1 and a driving transistor T2. The switching transistor T1 is connected to a scan line SL1 and a data line DL1, and transmits a data voltage input to the data line DL1, according to a switching voltage input to the scan line SL1, to the driving transistor T2. The storage capacitor C1 is connected to the switching transistor T1 and a power source line VDD, and stores a voltage that corresponds to a voltage difference between a voltage transmitted from the switch transistor T1 and a voltage supplied from the power source line VDD.

The driving transistor T2 is connected to the power source line VDD and the storage capacitor C1, to supply an output current IOLED that is proportional to the square of a voltage difference between the voltage stored in the storage capacitor C1 and a threshold voltage. The organic light-emitting element L1 emits light according to the output current IOLED. The driving transistor T2 includes a source electrode 57, a drain electrode 58, and a gate electrode 59. The anode 54 of the organic light-emitting element L1 may be connected to a drain electrode 58 of the driving transistor T2. However, the configuration of the sub-pixel may be variously modified. A cell glass 52 is sealed to a cell glass 51, with a gap therebetween, by a sealant, to protect driving circuits and organic light-emitting elements formed on the cell glass 51.

Figure 5:
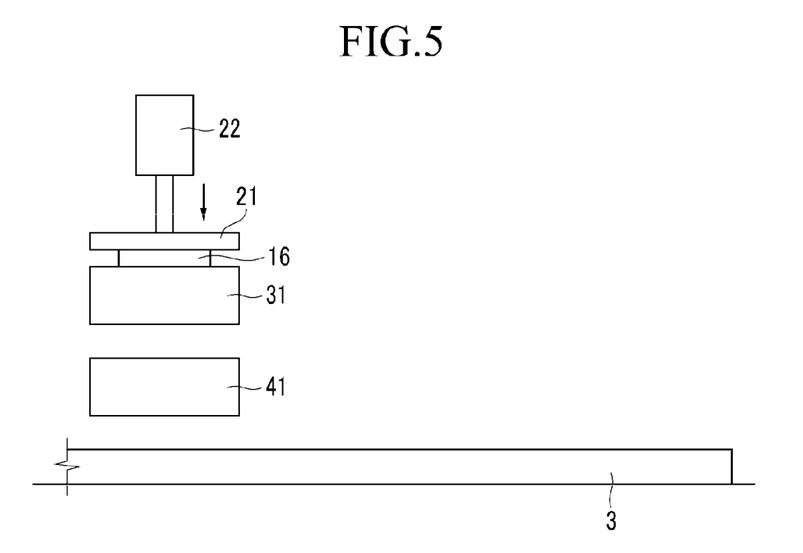
FIG. 5 is a diagram illustrating cells loaded on a first shuttle test board disposed in a loading location and a second shuttle test board disposed below the loading location.

Hereinafter, a process for transferring the cells 16 to the loading location from the scribing table and then to the testing location will be described with reference to FIGS. 5 to 12. Referring to FIG. 5 the cells 16 are disposed on the first shuttle test board 31 at the loading location, and the second shuttle test board 41 is disposed below the first shuttle test board 31, in a lowered position. In this state, the connection unit 21 is lowered, due to the extension of the actuator 22, and the cells 16 transferred from the scribing table 12 are loaded on the first shuttle test board 31. The second shuttle test board 41 is located below the first shuttle test board 31, due to retraction of the actuators 43, and thus, it does not interfere with movement of the first shuttle test board 31.

Figure 6:
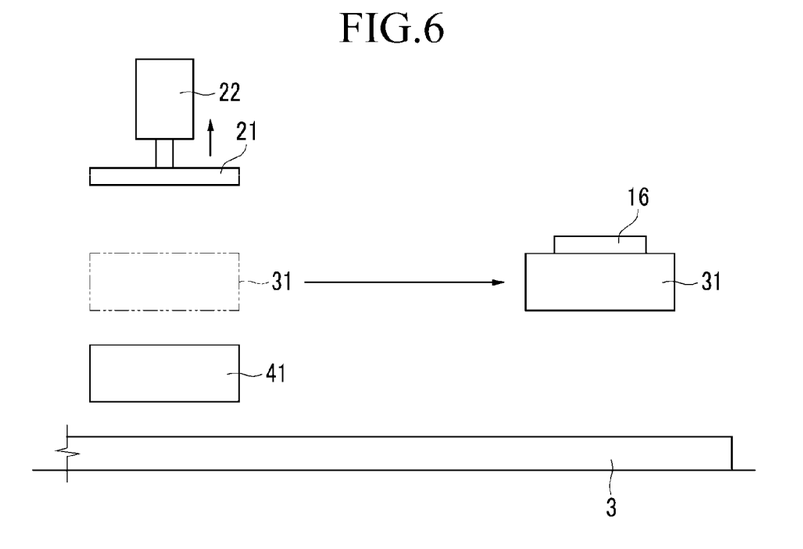
FIG. 6 is a diagram illustrating that the first shuttle test board being transferred to a test location from the loading location.

Referring to FIG. 6, the connection unit 21 is lifted, due to retraction of the actuator 22, after the cells 16 are loaded on the first shuttle test board 31. The first shuttle test board 31 is then transferred to the testing location from the loading location, while the second shuttle test board 41 remains in the lowered position, below the loading location.

Figure 7:
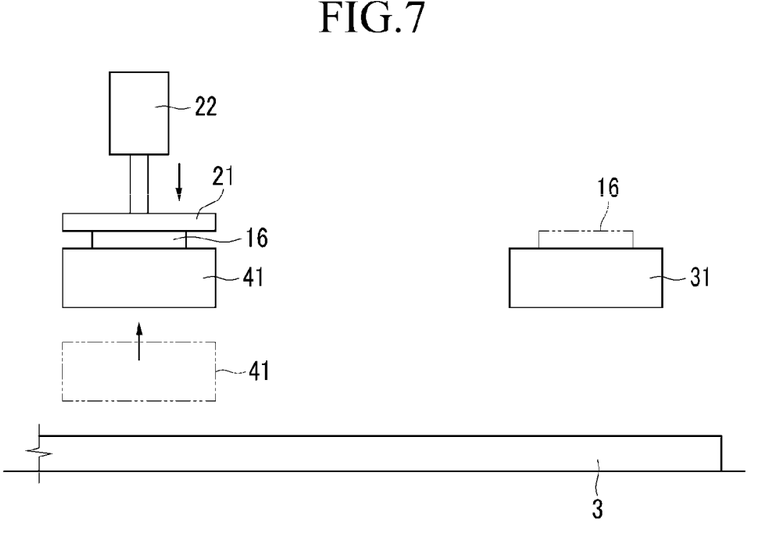
FIG. 7 is a diagram illustrating the cells being tested on the first shuttle test board and the second shuttle test board moving to the loading location.

Referring to FIG. 7, a test is performed on the cells 16 on the first shuttle test board 31, at the testing location. The cells 16 are then removed. The second shuttle test board 41 is raised into the loading location, due to the extension of the actuators 43, and the connection unit 21 is lowered by to the extension of the actuator 22, the cells 16 are loaded onto the second shuttle test board 41.

Figure 8:
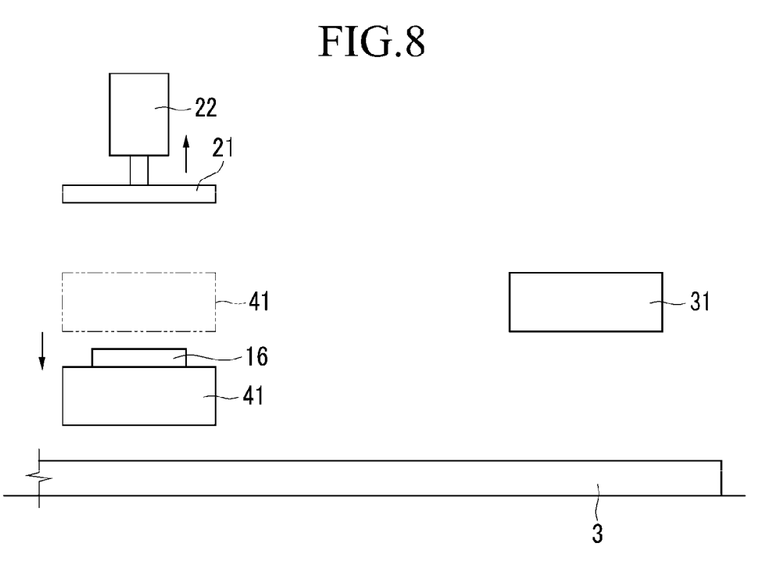
FIG. 8 is a diagram illustrating the second shuttle test board being lowered from the loading location.

Referring to FIG. 8, the cells 16 have been removed from the first shuttle test board 31, after the testing is complete. The second shuttle test board 41 is lowered, due to the retraction of the actuators 43, and the connection unit 21 is raised, due to the retraction of the actuator 22.

Figure 9:
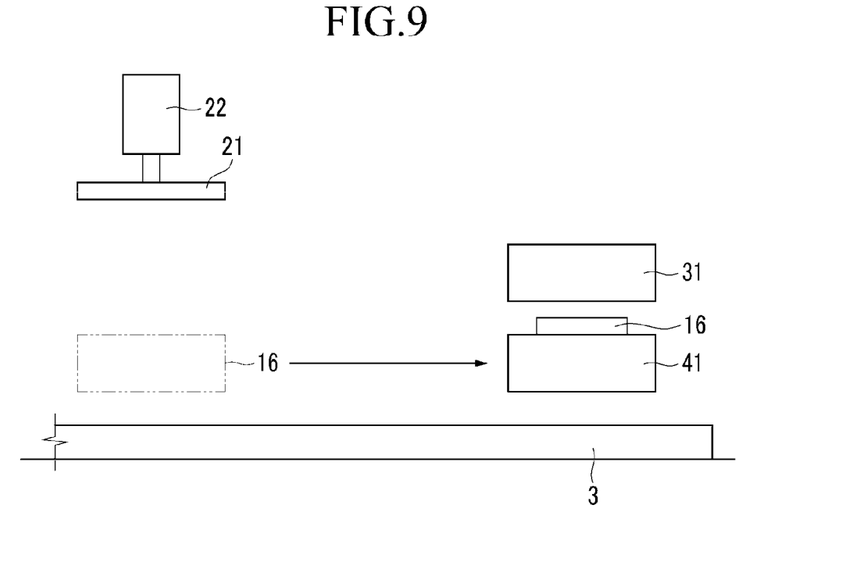
FIG. 9 is a diagram illustrating the second shuttle test board being transferred to a position below the testing location.

Referring to FIG. 9, the first shuttle test board 31 may remain at the testing location, while the second shuttle test board 41 is transferred to the testing location, or they may move simultaneously. The second shuttle test board 41 is located below the first shuttle test board 31, so that they do not interfere with each other.

Figure 10:
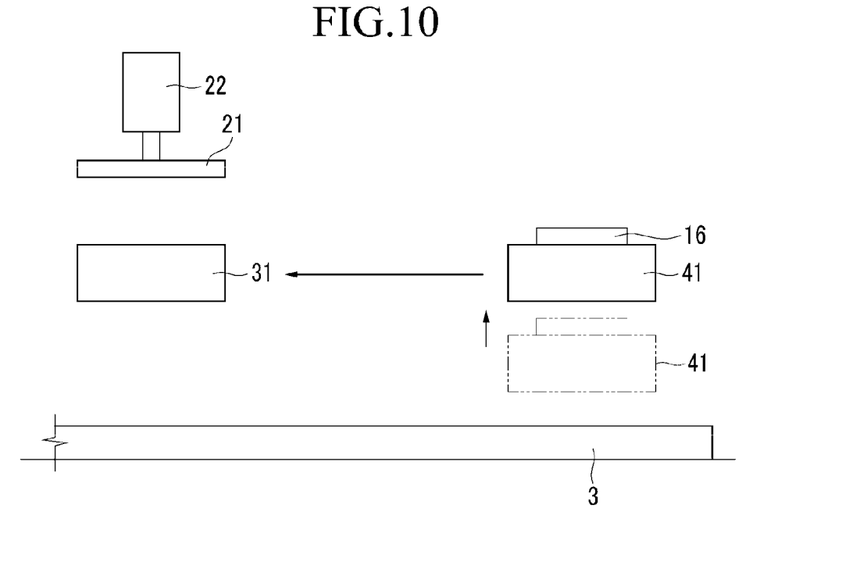
FIG. 10 is a diagram illustrating the first shuttle test board being transferred to the loading location from the testing location and the second shuttle test board being lifted to the testing location.

Referring to FIG. 10, the first shuttle test board 31 is transferred to the loading location. Meanwhile, the second shuttle test board 41 is raised up to the testing location, by the actuators 43.

Figure 11:
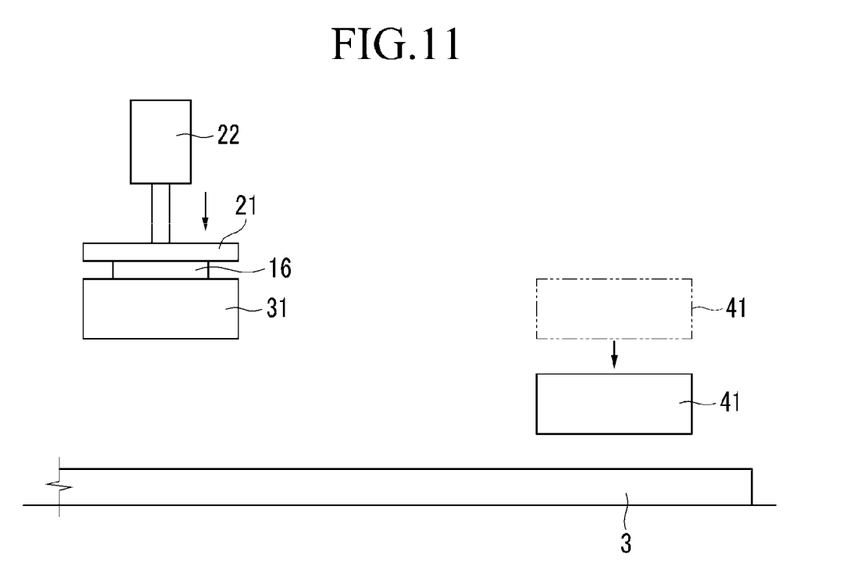
FIG. 11 is a diagram illustrating the cells being loaded on the first shuttle test board at the loading location and the second shuttle test board being lowered from the testing location.

Referring to FIG. 11, the connection unit 21 is lowered by the actuator 22, to load the cells 16 on the first shuttle test board 31. Meanwhile, the second shuttle test board 41 is lowered by the actuators 43, after the tested cells 16 are removed therefrom.

Figure 12:
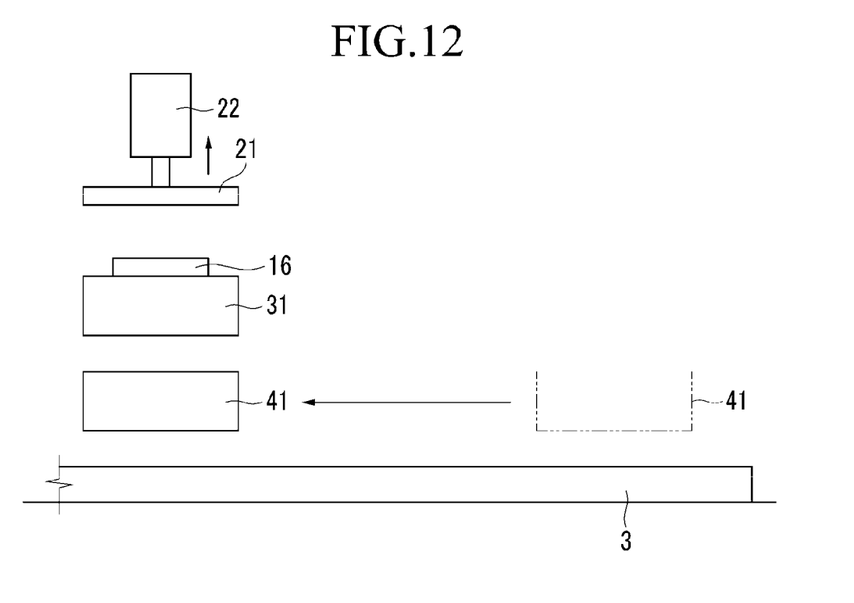
FIG. 12 is a diagram illustrating the second shuttle test board being transferred to a position below the loading location.

Referring to FIG. 12, the connection unit 21 is raised by the actuator 22, after the cells 16 are loaded on the first shuttle test board 31. The first shuttle test board 31 remains in the loading location, and the second shuttle test board 41 is moved to below the loading location from the testing location. Since the second shuttle test board 41 is located below the first shuttle test board 31, they do not interfere with each other.

According to some aspects, the movements of the first and second shuttles 30 and 40 can occur simultaneously and/or be modified, so as to increase processing efficiency. In particular, the first and second shuttles 30 and 40 can both be moving between the loading location and the testing location, so long as the second shuttle 40 passes below the first shuttle 30.

As described above, the cell transfer apparatus 2 transfers the cells 16 to the loading location from the scribing table 12, using the third guide 24, the third motor 23, the actuator 22, and the connection unit 21, so that the cells 16 can be stably loaded on the first and second shuttle test boards 31 and 41.

In addition, the cell transfer apparatus 2 stably transfers the cells 16 from the loading location to the testing location, using the first and second guides 34 and 45, the first and second motors 33 and 44, and the first and second shuttle test boards 31 and 41. That is, the cells 16 can be protected from driving impacts by using the first and second shuttle test boards 31 and 41, as compared to a conveyor system. Thus, the cell glasses 51 and 52 of the cells 16 can be prevented from being broken, and the quality of the cell 16 can be maintained.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:
1. An organic light-emitting display (OLED) panel cell transfer apparatus comprising:
   a base;
   a scribing table disposed on or adjacent to the base, to cut OLED panel sticks into cells;
   a cell transfer unit disposed above the base, to move the cells from the scribing table to a loading location;

a first shuttle disposed on the base, to receive the cells from the cell transfer unit, at the loading location, and to reciprocate between the loading location and a testing location, to transfer the cells therebetween; and a second shuttle disposed on the base, to receive the cells from the cell transfer unit, at the loading location, and to reciprocate between the loading location to the testing location, to transfer the cells therebetween, the second shuttle being extended away from the base to reach the loading and testing locations, and is contracted toward the base, while reciprocating, the cell transfer unit comprising:

a connection unit to pick up the cells from the scribing table, by applying a negative pressure to the cells;

a third guide disposed above the base, extending from the scribing table to the loading location;

an actuator to raise and lower the connection unit with respect to the third guide; and a third motor to move the connection unit along the third guide.

2. The organic light-emitting display panel cell transfer apparatus of claim 1, the first shuttle comprising:

a first shuttle test board to support the cells;

first guides disposed on the base, extending from the loading location to the testing location;

supports to connect the first shuttle test board to the first guides; and a first motor to move the first shuttle test board along the first guides.

3. The organic light-emitting display panel cell transfer apparatus of claim 2, the supports being connected to opposing edges of the first shuttle test board; and the first motor connecting one of the supports to one of the first guides.

4. The organic light-emitting display panel cell transfer apparatus of claim 2, the second shuttle comprising:

a second shuttle test board to support the cells;

second guides disposed on the base, extending from the loading location to the testing location;

actuators to raise and lower the second shuttle test board, with respect to the second guides; and a second motor to move the second shuttle test board along the second guides.

5. The organic light-emitting display panel cell transfer apparatus of claim 4, the second shuttle passing below the first shuttle, between the supports, when reciprocating.

6. The organic light-emitting display panel cell transfer apparatus of claim 4, the first and second guides being parallel, and the second guides being disposed between the first guides.

7. An organic light-emitting display (OLED) panel cell transfer apparatus comprising:

a base;

a scribing table disposed on the base, to cut OLED panel sticks into cells;

a cell transfer unit disposed above the base, to move the cells from the scribing table to a loading location;

a first shuttle disposed on the base, to receive the cells from the cell transfer unit, and to transfer the cells to a testing location; and a second shuttle disposed on the base, to receive and transfer the cells from the cell transfer unit to the testing location, along the same route as the first shuttle, by retracting to pass below the first shuttle, the cell transfer unit comprising:

a connection unit to pick up the cells from the scribing table, by applying a negative pressure to the cells;

a third guide disposed above the base, extending from the scribing table to the loading location;

an actuator to raise and lower the connection unit with respect to the third guide; and a third motor to move the connection unit along the third guide.

8. The organic light-emitting display panel cell transfer apparatus of claim 1, the first shuttle including first guides disposed on the base, to guide the first shuttle from the loading location to the testing location; and the second shuttle comprising second guides disposed on the base, between the first guides, to guide the movement of the second shuttle from the loading location to the testing location.

9. A method of transferring organic light-emitting display panel cells from a loading location to a testing location, using first and second shuttles, the method comprising:

loading the cells on the first shuttle, in the loading location, while the second shuttle is disposed below the first shuttle;

moving the first shuttle to the testing location;

raising the second shuttle to the loading location and testing the cells disposed on the first shuttle;

lowering the second shuttle and removing the cells from the first shuttle;

moving the second shuttle below the first shuttle; and moving the first shuttle to the loading location and raising the second shuttle to the testing location, the cell transfer unit comprising:

a connection unit to pick up the cells from the scribing table, by applying a negative pressure to the cells;

a third guide disposed above the base, extending from the scribing table to the loading location;

an actuator to raise and lower the connection unit with respect to the third guide; and a third motor to move the connection unit along the third guide.

10. The method of claim 9, the operations being sequentially repeated a plurality of times.

* * * * *